(12) United States Patent
Baier

(10) Patent No.: US 7,786,400 B2
(45) Date of Patent: *Aug. 31, 2010

(54) OPERATING DEVICE WITH AN OPERATING FIELD AND A SENSOR ELEMENT FOR AN ELECTRICAL APPLIANCE AND METHOD FOR OPERATING THE OPERATING DEVICE

(75) Inventor: Martin Baier, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 986 days.

This patent is subject to a terminal disclaimer.

(21) Appl. No.: 11/461,932

(22) Filed: Aug. 2, 2006

(65) Prior Publication Data

US 2006/0267962 A1 Nov. 30, 2006

Related U.S. Application Data

(63) Continuation of application No. PCT/EP2005/000705, filed on Jan. 25, 2005.

(30) Foreign Application Priority Data

Feb. 2, 2004 (DE) .................. 10 2004 005 954

(51) Int. Cl.
  *H03K 17/975* (2006.01)
(52) U.S. Cl. .................. 200/600; 200/511; 219/483; 219/506
(58) Field of Classification Search .................. 200/600, 200/511, 85 R, 86 R, 515, 312; 219/483–487, 219/506–510, 496
See application file for complete search history.

(56) References Cited

U.S. PATENT DOCUMENTS

| | | | |
|---|---|---|---|
| 3,668,417 A * | 6/1972 | Sessler et al. | ............... 307/113 |
| 5,517,076 A | 5/1996 | Takeuchi et al. | |
| 5,917,165 A | 6/1999 | Platt et al. | |
| 5,995,877 A | 11/1999 | Brueggemann et al. | |
| 7,250,596 B2 | 7/2007 | Reime | |

(Continued)

FOREIGN PATENT DOCUMENTS

DE        26 23 930        12/1977

(Continued)

OTHER PUBLICATIONS

European Office Action for European Application No. 05 715 207.6 dated Mar. 12, 2009.

(Continued)

*Primary Examiner*—Edwin A. Leon
*Assistant Examiner*—Marina Fishman
(74) *Attorney, Agent, or Firm*—Alston & Bird LLP

(57) ABSTRACT

An operating device for an electrical appliance, for example a cooking appliance, is provided with a deformable metallic control panel, underneath which an electret microphone cartridge is disposed. The membrane of the microphone cartridge can be coupled to the lower side of the control panel by means of an elastomer. When pressure is exerted on the control panel by a user pressing on the operating field and causing it to deflect, the membrane of the electret microphone is moved, which in turn causes movement in the microphone and causes a signal that can be evaluated as the operating input by a user.

16 Claims, 2 Drawing Sheets

U.S. PATENT DOCUMENTS

2005/0226455 A1* 10/2005 Aubauer et al. ............. 381/388

FOREIGN PATENT DOCUMENTS

| DE | 141443 | 4/1980 |
| DE | 3407380 A1 | 9/1984 |
| DE | 197 06 168 A1 | 8/1998 |
| DE | 198 11 372 A1 | 9/1999 |
| DE | 198 17 195 C1 | 9/1999 |
| DE | 199 18 290 C1 | 1/2001 |
| DE | 100 52 585 A1 | 5/2002 |
| EP | 0 831 276 A1 | 3/1998 |
| WO | WO 03094573 A1 * | 11/2003 |

OTHER PUBLICATIONS

German Search Report for German Application No. 10 2004 005 954.3, dated Apr. 1, 2005.

International Search Report from PCT/EP2005/000705 dated Jun. 8, 2005.

DRD, Sheet Metal Gage Conversion, Retrieved from Internet Site http://www.drd.com/searchable/techsupport/gageconversion.html, May 13, 2010, 1 page total, DRD.

Wiktionary, Sheet Metal, Retrieved from Internet Site http://en.wiktionary.org/wiki/sheet_metal, May 13, 2010, 1 page total, Wiktionary.

Wikipedia, Thin Film, Retrieved from Internet Site http://en.wikipedia.org/wiki/Thin_Film, Jun. 1, 2010, 5 pages total, Wikipedia.

Office Action from parallel Japanese Application No. JP2006-550075 dated Mar. 23, 2010.

* cited by examiner

OPERATING DEVICE WITH AN OPERATING FIELD AND A SENSOR ELEMENT FOR AN ELECTRICAL APPLIANCE AND METHOD FOR OPERATING THE OPERATING DEVICE

CROSS REFERENCE TO RELATED APPLICATIONS

This application claims priority from PCT application no. PCT/EP2005/000705, filed Jan. 25, 2005, which is based on German Application No. 102004005954.3, which was filed Feb. 2, 2004, of which the contents of both are hereby incorporated by reference.

FIELD OF APPLICATION AND PRIOR ART

The invention relates to an operating device for an electrical appliance, preferably a domestic appliance, as well as a method for evaluating or operating such an operating device.

BACKGROUND INFORMATION

It is known from the prior art of DE-A-19645678 or DE-A-19811372, to provide an operating panel for an electrical appliance or domestic appliance under which at a specific application forming a so-called operating field is provided a pressure-sensitive piezoelectric element. If a pressure is exerted on the cover, which can be made from thin high-grade steel or aluminium for example, said pressing action through the piezoelectric element can be evaluated as a desired operation. An associated evaluation or control gives a signal to the electrical appliance. It is considered disadvantageous that the use of piezoelectric elements give rise to certain disadvantages, particularly because they are in part mechanically fault-prone and cannot be easily installed in an appliance. It is also frequently necessary to use special manufactures or components for piezoelectric elements, which negatively influences expenditure, particularly costs and short-term availability. The use of other sensor elements, such as capacitive or optical sensor elements, suffers from the disadvantage that they can only be used behind metallic operating panels at present at a high cost or not at all or an optical transparency is vital for an optical system.

BRIEF DESCRIPTION OF THE DRAWINGS

The invention is described in greater detail hereinafter relative to embodiments and the attached diagrammatic drawings, wherein show.

DETAILED DESCRIPTION

Figure 1:
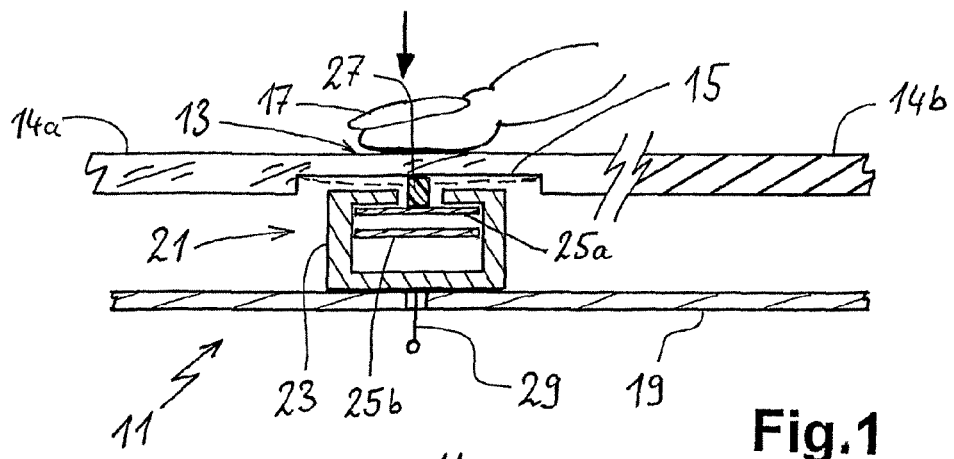
FIG. 1 illustrates a section through an operating device according to the invention, two different materials for the operating fields being shown.

The problem solved by the invention is to provide such an operating device and method similar to the aforementioned types in such a way as to avoid the disadvantages of the prior art and in particular to permit the use of an operating device which can be constructed from standard components, as much as possible, with limited manufacturing expenditure.

This problem is solved by an operating device and methods as disclosed and claimed herein. Advantageous and preferred developments of the invention form the subject matter of the further claims and are explained in greater detail hereinafter. By express reference the wording of the claims is incorporated into the description.

According to one embodiment of the invention, the pressure-sensitive sensor element is constituted by an electret microphone capsule, which is advantageously a standard component. The electret microphone is relatively limited in size and, in particular, has a relatively small thickness. This electret microphone capsule converts the movement of the operating field which is transmitted to the capsule into an electrical signal. This can be evaluated as an operation (e.g., on or off indication provided by user) and it is possible to provide certain signal thresholds, as will be explained in greater detail hereinafter.

This makes it possible to use a conventionally used component, particularly a standard component as the pressure-sensitive sensor element. Such microphone capsules have the advantage of a high sensitivity. Even a relatively limited operating movement on the diaphragm, which conventionally evaluates sound pressure or waves, is sufficient for a reliable detection or differentiation. In addition, such standard components are obtainable in a completely connected and wired manner, which simplifies use and assembly and/or connection.

It is possible for the operating field to be part of a cover or panel, which can extend over a larger (and in some embodiments, a particular much larger area) of the electrical appliance. The cover can be contained in a frame of a hob (e.g. cooktop, heating element or stove), for example. In one embodiment, the operating field, cover, or panel is advantageously closed and has no interruptions. In particular, it is smooth or planar on the outside. As a result of such a closed construction, it is possible to provide an attractive design and a resistance to water or the like.

It is advantageous if the operating field (e.g., the area of operation of the corresponding cover or panel) is elastic in nature, or thinner in an area over the sensor element than it is elsewhere. In the case of an otherwise relatively thick cover or panel intended to offer mechanical strength and to avoid sagging, the cover can be pressed upon by the user in the vicinity of the operating field or at the sensor elements. Such thinner constructions can be made by providing a localized recess, or thinning the cover on the inside or back.

One possibility for the construction of an operating field or a panel or cover is to make it electrically conductive and/or from thin metal. It is possible to use metal sheets, which in particular, due to their resistance to mechanical effects and ability to withstand dirt, can be used with advantage. A preferred material is high-grade steel or aluminium for example.

According to a further embodiment of the invention, the sensor element is connected to or coupled to the operating field or cover by means of an advantageously elastic coupling element. A direct, physically complete coupling can be provided using a coupling element and advantageously leads to the underside of the operating cover or rear surface. Elasticity can be provided as a protection for the sensor element or the entire operating device in such a way that with a standard, prescribed operating force the coupling element is not, or is scarcely, compressed, i.e. essentially retains its shape and, in particular, effective length. Only when the operating force rises to such an extent that it far exceeds the standard, prescribed force, for example by a factor of 2 to 4 or higher than normal, is it possible to press in, or shorten, the coupling element. This prevents the user from over-pressing and potentially damaging or destroying the sensor element.

Numerous elastic components can be used as the coupling element. Preferably an elastomer is used and can be directly connected to the electret microphone capsule diaphragm.

According to another embodiment of the invention, a support can be provided below the operating field and the electret microphone capsule is placed thereon and is advantageously supported with respect to the operating field in such a way that although an operating force acts on the microphone capsule it does not cause sagging or deformation of the support. The support is advantageously a printed circuit board. Electrical contacts or leads provided for the control or evaluation can be placed thereon. In the case of a circuit board, they are advantageously constituted by corresponding conducting tracks. The support or circuit board can have a control circuit, or the like, provided for the microphone capsule and, for example, the complete electrical appliance.

In another embodiment of the invention, several operating fields or areas on the cover are provided for different functions or separate functional units of the electrical appliance instead of a single operating field on the operating device. These operating fields are preferably arranged groupwise, or in juxtaposed manner in an operating area, which can be correspondingly designed for special marking or identification. In one preferred embodiment, a one-piece, continuous cover is provided in which the operating fields are located or which inter alia form the operating area. This offers the advantage that manufacturing costs are kept lower and it can in particular be ensured that the cover is water-proof, etc. It is also advantageously possible to construct such a cover as a part which is separate and easily removable from the microphone capsules. This means that one or more electret microphone capsules, together with the control and evaluation, can be built upon such a support. A cover can then be placed thereon. In other embodiments, variants of the cover can be differently designed, as a function of the design requirements of different manufacturers or the intended use. This is particularly advantageous with metal or similar covers.

It is alternatively possible to fix an electret microphone capsule to the actual cover or form a type of module therefrom. The side with the diaphragm on which the operating pressure is to act can then be provided on the side directed away from the cover. Thus, the microphone capsule is pressed against a support or the like during operation. However, the fitting of the microphone capsule to the cover generally gives rise to increased connection costs in manufacturing for the electret microphone capsules. Prefabrication with a finished connection to a control or evaluation is no longer possible, and is only possible if the control or evaluation is located on the cover.

Advantageous, exemplified dimensions ensure that the operating field is only pressed in or deflected by a small amount for operation or detection by the electret microphone capsule. The deflection can be a maximum of 100 μm, and advantageously 1 μm to 10 μm. The resulting signal initiated at the microphone capsule can be examined for a type of threshold or signal value. Only on reaching or exceeding this signal is the signal looked upon as a desired, prescribed operation, which then leads to a corresponding initiation of the operating process for the appliance. Such an operating path or deflection is virtually undetectable by a user, which can be a desired feature, because the operating behaviour is then the same as with optical or capacitive contact switches for example, but without it being necessary to accept the aforementioned disadvantages thereof. The prescribed or intended operating force can be a few Newtons for example, which can lead to the aforementioned deflection in the case of a correspondingly constructed cover or operating field.

In a prescribed method for the evaluation of the operating device by pressure action on the operating area resulting from the user pressing the operating field, the electret microphone capsule or its diaphragm is deflected, and is reset following release. This process initiates signals, or forms a signal pattern, characteristic of the fundamental pattern. These signals or the signal pattern are then evaluated as an operation (e.g., a user activating or deactivating the control) if the signal is within the prescribed limits. In a simple variation, it is possible to evaluate the signal as an activation after the signal has reached the maximum necessary value by pressing or deflecting the cover, so that the signal is above the threshold for a certain time, for example more than half or one second.

In another construction, which in particular gives a different operating behaviour and a more reliable operation, the resetting signal can be awaited. In particular, there must be a certain time interval between the signal caused by the user pressing the cover and the resetting signal. This should be less than 5 seconds, advantageously less than 2 seconds. This means that if a user presses on the operating field for a desired operation and instinctively, or in accordance with practice, immediately or shortly thereafter releases the same, this is evaluated as an operating process. However, if the user accidentally places a heavier object on the user operating area of a cooktop, such as a saucepan, where the object remains there for a longer time period thereon, this is detected and no operation is evaluated.

Advantageously, the operating device and method is used for an electrical domestic appliance such as a hob, e.g., cooktop or other similar appliances such as washing machines, dryers, rinsing machines and microwaves.

These and further features of the preferred developments of the invention can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

Turning now to the figures, FIG. 1 shows in section an operating device 11, which is intended for a cooktop having a flat cover for example. An operating field 13 is provided in a plate or cover, which is shown in the left-hand area as a glass ceramic plate 14a. The right-hand area illustrates the extent to which it can also be a metal plate 14b. Beneath the operating field 13 is formed a thinner area of the cover 15, which essentially coincides with the extent of the operating field. Inscriptions or the like can be provided as markings on the top surface of the cover. In addition, the thinner area 15 on the top of the operating field 13 can face the user and consequently has a guidance function for the latter (e.g., where the user can place their finger for operating the appliance). It is shown how a finger 17 of a user is placed on the operating field 13. If a certain operating pressure is exerted, as described hereinbefore, the cover 14 in the thinner area 15 or operating field 13 deflects. This is illustrated by a downwardly curved broken line.

An electret microphone capsule 21 is placed on a support 19 beneath plate 14 and the operating field 13. The microphone capsule 21 comprises a housing 23, which in the manner shown contains the diaphragm 25. The microphone capsule 21 or diaphragm 25 is coupled to the underside of the thin area 15 by direct application by means of an elastomer part 27, which can be cylindrical for example. Thus, a movement of the thinner area 15 is directly transmitted to the diaphragm 25. Moreover, the microphone capsule 21 has an electrical connection or lead 29 to the outside. If the support 19 is constructed as a printed circuit board, the electrical connection or lead 29 can also be in the form of printed-on conducting paths.

Elastomer part 27 projects through an opening in the top of housing 23. This opening can also provide a certain guidance for elastomer part 27, but its mobility should not be restricted.

The thinner area 15 can advantageously be provided in cover 14, but is not required. This is more particularly dependent on the choice of material for operating field 13 or cover 14. If, as shown, the materials are relatively rigid or strong, such as metal 14b or glass ceramic 14a, it is advantageous, because this can bring about a certain deflection with the intended operating pressure.

Figure 3:
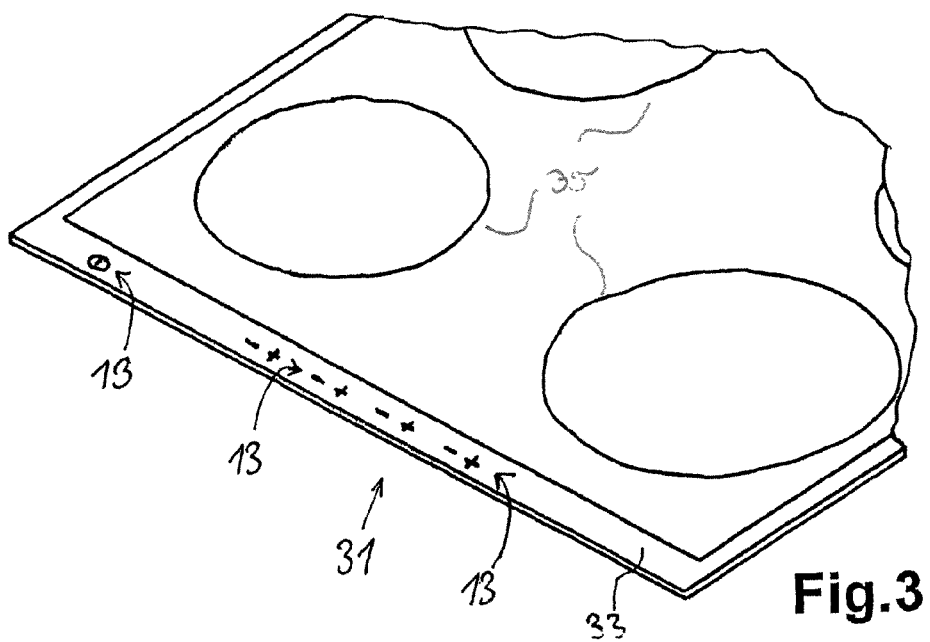
FIG. 3 illustrates an oblique view of a hob, where an operating device according to FIG. 1 is integrated into the frame.

FIG. 3 shows a cooktop 31, using so-called glass ceramic hobs. In conventional manner it has an all-round hob frame 33, which on the left-hand, lower side is constructed as a front surface directed towards a user. The frame 33 has various operating fields 13, namely to the far left an ON-OFF switch and in the central area switches for the power adjustment of the individual hotplates 35 and which are diagrammatically illustrated in circular form. In each case, the associated function can be initiated by pressure on the operating fields 13. From the construction standpoint, under the hob frame 33 is provided an operating device similar to that of FIG. 1. The surface of the hob frame 33 or the latter can be formed from a metal coating, plate or foil corresponding to the cover 14 of FIG. 1. Beneath the operating fields 13, there is the microphone capsule according to FIG. 1, and the remaining area of the hob frame 33 the metal can be solidly lined (e.g., of regular thickness).

Alternatively, the hob frame can be made from a possibly several mm thick flat material, which can be metallic or have some other construction. The matter may have its thickness reduced from below, in the vicinity of the operating fields 13 or an associated operating device, in such a way that in said thinned areas the microphone capsule 21 of FIG. 1 can be housed. As an alternative to a thinning out of a thicker metal layer from below, the thinning of the material can also take place from above. In this case, a resulting depression could be used as structuring for a precise application of a finger or the like.

Figure 4:
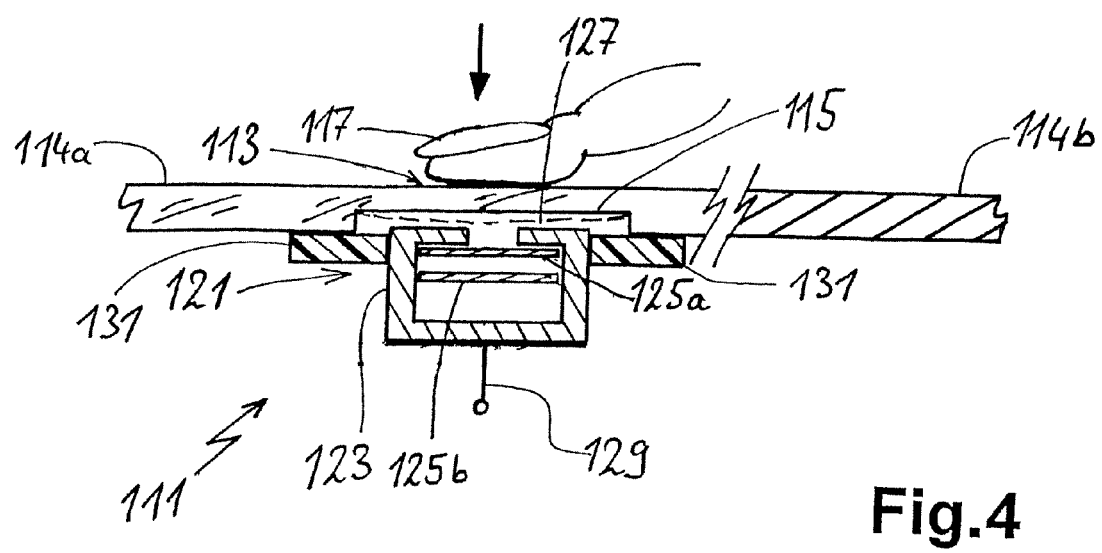
FIG. 4 illustrates another embodiment.

Another embodiment is illustrated in FIG. 4. In FIG. 4, wherein a glass ceramic plate 114a (or metal place 114b) is shown with an operating field 113, which is contacted by a user's finger 117. The operating device 111 comprises a circuit board 131, a microphone capsule 121 comprising a housing 123, two diaphragms 125a, 125b and wire lead 129. In this embodiment, the printed circuit board 131 is positioned up against the plate 114, and there is no elastomeric component as is shown in FIG. 1. When the user's finger presses on the operating field 113, a deflection 127 occurs.

Function

Through the application of the finger 17 to operating field 13 whilst exerting a certain pressure falling within the range indicated hereinbefore, the operating field 13 or thinner area 15 is deflected downwards. The deflection can be a few μm, for example 2 μm to 10 μm with an operating force of approximately 2 Newtons. The electret microphone capsule converts this small movement into an electrical signal, as is shown in exemplified manner in FIG. 2.

In the present invention, the microphone capsule 21 is not used for producing an electrical signal as the result of transforming sound pressure into a movement. Instead a mechanical movement, which takes place by the coupling using elastomer part 27 to the underside of the operating field 13, is directly converted into an electrical signal. Elastomer 27 serves to compensate mechanical tolerances in connection with the spacing between diaphragm 25 and the underside of operating field 13. It can also provide a type of overpressure protection, as explained hereinbefore.

Figure 2:
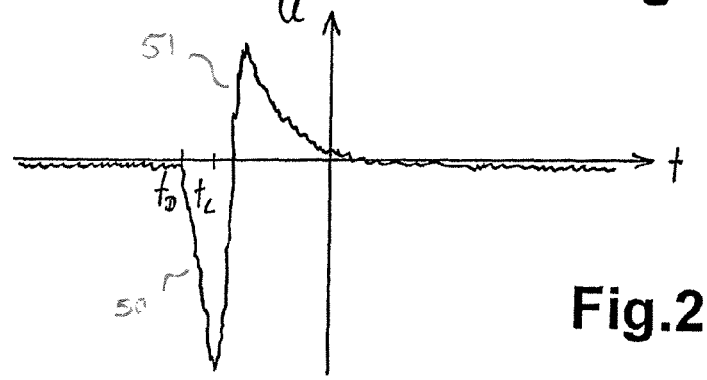
FIG. 2 illustrates a graph of the signal voltage over time during an operating process.

The graph of FIG. 2 shows how the signal voltage U of microphone capsule 21 changes over time during operation. At time $t_D$ the finger 17 is placed on the operating field 13 and presses the location, which leads to the portion 50 in the negative area. At time $t_L$ finger 17 is removed, so that the thinner area 15 or operating field 13 moves upwards again into the original position and in the same way diaphragm 25 can again move upwards. There is consequently a change of the signal curve to the positive area 51 and then it finally tilts over again so as to pass to the original, low voltage value.

The desired operation (e.g., activating the function or control by the user) can be concluded from this typical curve pattern for an operating process. As a function of the desired use or evaluating method for the operation, either the pressing action, or the release, can be looked upon as the desired operating indication. If a particularly rapid reaction to an operating process is desired, then upon pressing, i.e. during the drop of the signal curve, an operating process can be detected as such and a function initiated as from a specific value, which corresponds to a specific operating path. However, if certain undesired or faulty actuations, for example through the application of objects or an unintentional wiping over an operating field are to be excluded, then it is recommended that the release time be awaited. This must be in a given time window with respect to the pressing time, for example approximately 1 second. These different methods can be deposited or filed in an associated evaluation or control circuitry and performed in this way.

The invention claimed is:

1. An operating device for operation of an electrical appliance, wherein said operating device has a cover, a portion of which comprises an operating field, wherein said operating field is uninterrupted and wherein a thickness of said cover in the vicinity of said operating field is thinner than the remainder of said cover, said operating field capable of deflection upon application of pressure by a user's finger and at least one pressure-sensitive sensor element below said operating field and coupled to said operating field, wherein said operating device is configured to operate in response to the user's finger pressing on said operating field effecting a movement of said operating field, wherein said sensor element comprises an electret microphone capsule for converting said movement of said operating field into an electrical signal for evaluation as an operation of said operating device, wherein a diaphragm of said sensor element is connected by an elastic coupling element to said operating field.

2. The operating device according to claim 1, wherein said operating field is an electrically conductive material.

3. The operating device according to claim 1, wherein said operating field is made from a material comprising sheet metal.

4. The operating device according to claim 3, wherein said operating field is made from steel.

5. The operating device according to claim 1, wherein said connection to said operating field is a direct coupling by said elastic coupling element to the underside of said operating field.

6. The operating device according to claim 1, wherein an elasticity of said elastic coupling element is such that in the case of when a standard operating force of less than 2 Newtons said coupling element is applied, said elastic coupling element is largely uncompressed.

7. The operating device according to claim 1, wherein said coupling element is an elastomer directly connected to the diaphragm of said electret microphone capsule.

8. The operating device according to claim 1, wherein a support is provided below said operating field.

9. The operating device according to claim 8, wherein said support is a printed circuit board, on which is placed said electret microphone capsule.

10. The operating device according to claim 1, comprising a plurality of operating fields arranged in a juxtaposed manner and wherein each of said operating fields is formed by a one-piece, continuous cover.

11. The operating device according to claim 1, comprising an operating area comprising several said operating fields, wherein said operating fields are formed by a one-piece, continuous cover.

12. The operating device according to claim 1, wherein said operation is constituted by an electrical signal of said electret microphone capsule generated in response to the deflection of said operating cover in the range of 1 to 100 µm.

13. A method for evaluating a user input to an operating device controlling an appliance comprising the steps of:
a user pressing an operating field of a cover of said operating device with the user's finger, wherein said operating field is uninterrupted and made from sheet metal, wherein said operating field has a thickness in the vicinity of said operating field that is thinner than the remainder of said cover, wherein pressing said operating field causes a deflection of the operating field in the range of 1 to 100 µm and application of pressure onto an electret microphone capsule coupled below the cover and initiating a signal from said electret microphone;
determining the signal has reached a threshold;
determining a first time associated with the signal reaching the threshold;
the user releasing the operating field of the cover, thereby removing application of the pressure on the electret microphone and resetting the signal;
determining a second time associated with the resetting of the signal; and
determining the signal indicates an input for controlling the appliance by determining a time interval between the first time and the second time is of a minimum duration.

14. A method according to claim 13, wherein said time interval is less than five seconds.

15. A method according to claim 14, wherein said time interval is less than two seconds.

16. An operating device for operation of an electrical appliance, said operating device comprising:
a cover, a portion of said cover comprising an operating field capable of deflection upon application of pressure by a user's finger, wherein said operating field is uninterrupted; and
at least one pressure-sensitive sensor element below said operating field,
wherein said at least one pressure-sensitive sensor element comprises an electret microphone capsule where an elastic coupling element comprising an elastomer is directly connected to a diaphragm of said electret microphone capsule and to said operating field,
wherein said operating device is configured to operate in response to the user's finger pressing on said operating field effecting a movement of said operating field,
wherein said sensor element converts said movement of said operating field into an electrical signal for evaluation as an operation of said operating device.

* * * * *